(12) United States Patent
Kim

(10) Patent No.: US 8,854,909 B2
(45) Date of Patent: Oct. 7, 2014

(54) SEMICONDUCTOR MEMORY DEVICE AND METHOD OF TESTING THE SAME

(71) Applicant: SK Hynix Inc., Icheon (KR)

(72) Inventor: Suk Min Kim, Suwon (KR)

(73) Assignee: SK Hynix Inc., Icheon (KR)

( * ) Notice: Subject to any disclaimer, the term of this patent is extended or adjusted under 35 U.S.C. 154(b) by 0 days.

(21) Appl. No.: 14/252,421

(22) Filed: Apr. 14, 2014

(65) Prior Publication Data
US 2014/0226422 A1 Aug. 14, 2014

Related U.S. Application Data

(62) Division of application No. 13/347,584, filed on Jan. 10, 2012, now Pat. No. 8,737,152.

(30) Foreign Application Priority Data

Nov. 24, 2011 (KR) ......................... 10-2011-0123816

(51) Int. Cl.
| G11C 7/00 | (2006.01) |
| G11C 29/50 | (2006.01) |
| G11C 11/4097 | (2006.01) |
| G11C 11/4094 | (2006.01) |
| G11C 7/12 | (2006.01) |
| G11C 7/18 | (2006.01) |

(52) U.S. Cl.
CPC ........ *G11C 29/50* (2013.01); *G11C 2029/5004* (2013.01); *G11C 11/4097* (2013.01); *G11C 11/4094* (2013.01); *G11C 7/12* (2013.01); *G11C 7/18* (2013.01)
USPC ............ 365/203; 365/201; 365/206; 365/208

(58) Field of Classification Search
CPC .. G11C 11/4097; G11C 11/4094; G11C 7/12; G11C 7/18
USPC .......................................... 365/203, 201, 205
See application file for complete search history.

(56) References Cited

U.S. PATENT DOCUMENTS 6,005,802 A * 12/1999 Takeuchi et al. ......... 365/185.02
6,049,494 A * 4/2000 Sakui et al. .................... 365/203
(Continued)

FOREIGN PATENT DOCUMENTS

KR 10-2007-0000174 A 1/2007

*Primary Examiner* — Viet Q Nguyen

(57) ABSTRACT

A semiconductor memory device including an open bit line structure is disclosed. The semiconductor memory device including an open bit line structure includes a first mat, a second mat contiguous to the first mat, a first sense amplifier coupled to a first bit line of the first mat, a second sense amplifier coupled to a second bit line of the first mat and a third bit line of the second mat, a third sense amplifier coupled to a fourth bit line of the second mat, and a plurality of bit line precharge voltage providers for varying a level of a bit line precharge voltage provided to the first, second, and third sense amplifiers, selectively providing the resultant bit line precharge voltage level, and providing the same voltage as that of data of a selected cell to a non-selected sense amplifier during a read operation.

4 Claims, 6 Drawing Sheets

(56) References Cited

U.S. PATENT DOCUMENTS

| | | | |
|---|---|---|---|
| 6,567,329 B2 * | 5/2003 | Somasekhar et al. | 365/207 |
| 6,785,157 B2 * | 8/2004 | Arimoto et al. | 365/149 |
| 7,193,884 B2 * | 3/2007 | Sekiguchi et al. | 365/149 |
| 7,200,061 B2 * | 4/2007 | Sekiguchi et al. | 365/207 |
| 7,772,911 B2 * | 8/2010 | Ide et al. | 327/291 |
| 7,973,582 B2 * | 7/2011 | Ide et al. | 327/261 |
| 8,737,152 B2 * | 5/2014 | Kim | 365/203 |
| 2011/0075498 A1 | 3/2011 | Song et al. | |

\* cited by examiner

SEMICONDUCTOR MEMORY DEVICE AND METHOD OF TESTING THE SAME

CROSS-REFERENCE TO RELATED APPLICATION

The present application is a divisional of U.S. patent application Ser. No. 13/347,584, filed on Jan. 10, 2012, which claims priority of Korean Patent Application No. 10-2011-0123816 filed on Nov. 24, 2011, which are incorporated by reference in their entirety.

BACKGROUND OF THE INVENTION

Embodiments of the present invention relate to a semiconductor memory device, and more specifically to a semiconductor memory device including an open bit line structure and a method of testing the semiconductor memory device.

Generally, as a degree of the integration of a semiconductor memory device such as a Double Data Rate Synchronous DRAM (DDR SDRAM) device has been rapidly increased, the semiconductor memory device has been designed to include tens of millions of memory cells therein.

A memory cell structure of the semiconductor memory device is classified into a folded bit line structure and an open bit line structure. A difference between the folded bit line structure and the open bit line structure will hereinafter be described in detail.

In the folded bit line structure, a bit line, e.g., a true bit line, where data is driven and a bit line, e.g., a false bit line, used as a reference in an operation of amplifying the driven data are arranged in the same memory cell mat on the basis of a bit line sense amplifier arranged in a core region of the semiconductor memory device.

As a result, the same noise is reflected on the true bit line and the false bit line, and noise generated in the true bit line and noise generated in the false bit line are counterbalanced with each other. Through the counterbalancing operation, the folded bit line structure can guarantee stable operations irrespective of noise.

On the other hand, in the open bit line structure, a true bit line and a false bit line are arranged in different memory cell mats on the basis of a bit line sense amplifier. Therefore, noise generated in the true bit line is different from noise generated in the false bit line, and thus the open bit line structure is vulnerable to such noise.

A unit memory cell structure for use in the folded bit line structure has been designed in 8F2, and a unit memory cell structure for use in the open bit line structure has been designed in 6F2.

The unit memory cell structure is used as an important element for deciding the size of the semiconductor memory device. Assuming the same data storage amount, a semiconductor memory device including the open bit line structure can be designed to be smaller than a semiconductor memory device including the folded bit line structure.

FIG. 1 illustrates a circuit diagram of a memory cell array including a general folded bit line structure.

In FIG. 1, reference numbers 10 and 11 indicate memory cell mats, and a reference number 12 indicates a sense-amplifier region disposed between the memory cell mats 10 and 11. The memory cell array is generally composed of a plurality of memory cell mats and sense-amplifier regions.

In FIG. 1, bit lines BLT0A, BLB0A, BLT1A, BLB1A, BLT2A, and BLB2A and bit lines BLT0B, BLB0B, BLT1B, BLB1B, BLT2B, and BLB2B indicate bit lines coupled to memory cell transistors (not shown) in the memory cell mats 10 and 11, respectively.

A bit line equalizing signal BLEQB is a control signal for equalizing the bit lines with equal potential. Control signals SHL and SHR connect the bit lines to the sense-amplifier region. A bit line precharge voltage VBLP is a precharge voltage for precharging the bit lines.

Drive signals CSP or CSN indicate drive voltages of a sense amplifier. A column selection signal YS is a signal for selecting an internal column address. Local input/output lines LIO and LIOB are lines used for receiving data from bit lines selected by the column selection signal YS and transmitting the received data to an external part.

However, as a bit line structure of the semiconductor memory device is changed from the folded bit line structure to the open bit line structure, the true bit line BL and the false bit line BLB are disposed in different memory cell mats.

If the true bit line BL and the false bit line BLB that are used to operate the same sense amplifier are located in different memory cell mats, a noise effect is different in the true bit line BL and the false bit line BLB during a sensing operation.

FIG. 2 illustrates a write recovery (tWR) test for use in a conventional semiconductor memory device.

Referring to FIG. 2, upon receiving data from an external part in response to a write command WT, a column selection signal Yi is enabled to a high level. As a result, under the condition that a word line WL is enabled to a high level, external data is written in a selected cell.

FIG. 2 shows that low data is newly received from the external part under the condition that high data is stored in the selected cell.

In this case, a time difference between an activation time of the write command WT and that of a precharge command PCG is defined as a write recovery (tWR) time. The tWR time is used as an index for estimating write characteristics.

According to the conventional tWR test shown in FIG. 2, it is determined whether or not the external data is correctly written in the selected cell by mandatorily reducing the tWR time.

That is, since the tWR time is very short, data stored in the selected cell is not changed from the previously stored high data to the low data received from the external part and thus it maintains the high data, such that the selected cell is determined as failed in a probe test.

The above-mentioned tWR test is used to screen a cell having poor write characteristics as the cell has resistance Rc at a high level, a threshold voltage Vt at a high level, or capacitance Cs at a low level.

However, in case of a cell having high cell resistance, e.g., contact resistance, channel resistance, etc., there is a probability that a failed cell is not screened even in the same tWR time as in a normal cell and thus is wrongly considered to be the normal cell.

In case of a cell having high cell resistance Rc, a small amount of charges is applied to a storage node SN due to such resistance, such that it is impossible to sufficiently write high data in the cell during a normal write operation. As a result, a write operation for writing low data in a cell storing high data can be easily achieved even with a reduced tWR time. That is, assuming that charges greater than an offset of a sense amplifier are guaranteed, the cell having high resistance can also pass the tWR test without any problems.

In conclusion, a high-resistance cell to be determined to be a failed cell can unexpectedly pass the tWR test. If the tWR time is excessively reduced to screen such defective cells, even normal cells may wrongly be over-screened.

BRIEF SUMMARY OF THE INVENTION

Various embodiments of the present invention are directed to providing a semiconductor memory device that may substantially obviate one or more problems due to limitations or disadvantages of the related art.

Embodiments of the present invention relate to a semiconductor memory device including an open bit line structure and a method of testing the semiconductor memory device, which adjust the coupling noise applied to a true bit line to be equal to the coupling noise applied to a false bit line in a test mode for a probe test, resulting in improving screenability of the probe test.

In accordance with one embodiment of the present invention, a semiconductor memory device including an open bit line structure includes a plurality of mats; a plurality of sense amplifiers disposed between the mats so as to sense/amplify data read from the mats; and a plurality of bit line precharge voltage providers for varying a level of a bit line precharge voltage provided to the sense amplifiers, selectively providing the resultant bit line precharge voltage level, and providing the same voltage as that of data of a selected cell to a non-selected sense amplifier from among the sense amplifiers during a read operation.

In accordance with another embodiment of the present invention, a semiconductor memory device including an open bit line structure includes a first mat; a second mat contiguous to the first mat; a first sense amplifier coupled to a first bit line of the first mat; a second sense amplifier coupled to a second bit line of the first mat and a third bit line of the second mat; a third sense amplifier coupled to a fourth bit line of the second mat; and a plurality of bit line precharge voltage providers for varying a level of a bit line precharge voltage provided to the first, second, and third sense amplifiers, selectively providing the resultant bit line precharge voltage level, and providing the same voltage as that of data of a selected cell to a non-selected sense amplifier during a read operation.

In accordance with another embodiment of the present invention, a method of testing a semiconductor memory device including and open bit line structure, the method comprising, providing a selected cell storing first data and a non-selected cell storing second data that has a logic state opposite to that of the first data, wherein the selected cell and the non-selected cell are coupled to a selected word line and disposed adjacent to each other; activating the selected word line to read out the data stored in the selected cell and the non-selected cell; and sensing and amplifying a voltage level loaded on a first bit line coupled to the selected cell to determine whether or not the selected cell is failed, wherein, when sensing and amplifying the voltage level loaded on the first bit line, a bit line precharge voltage corresponding to the first data stored in the selected cell is provided to a third bit line adjacent to a second bit line coupled to a sense amplifier that senses and amplifies the voltage level loaded on the first bit line, the second and third bit line being disposed in a second memory cell mat that is adjacent to a first memory cell mat where the selected cell is disposed.

It is to be understood that both the foregoing general description and the following detailed description of the present invention are exemplary and explanatory and are intended to provide further explanation of the invention as claimed.

DESCRIPTION OF EMBODIMENTS

Reference will now be made in detail to the embodiments of the present invention, examples of which are illustrated in the accompanying drawings. Wherever possible, the same reference numbers will be used throughout the drawings to refer to the same or like parts. A semiconductor memory device according to an embodiment of the present invention will hereinafter be described with reference to FIG. 3.

Figure 1:
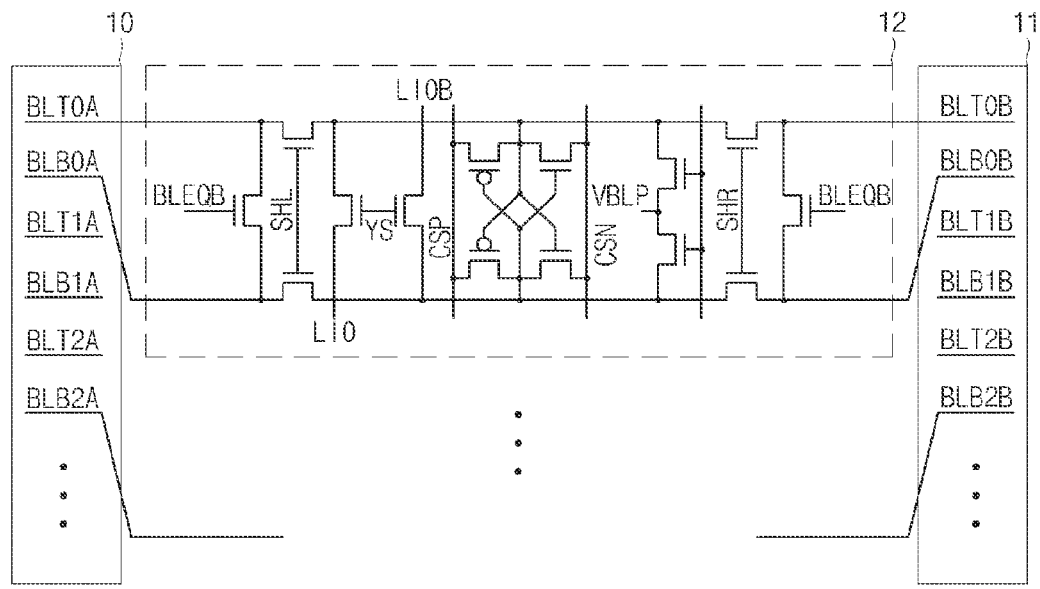
FIG. 1 illustrates a circuit diagram of a memory cell array including a general folded bit line structure.
Figure 2:
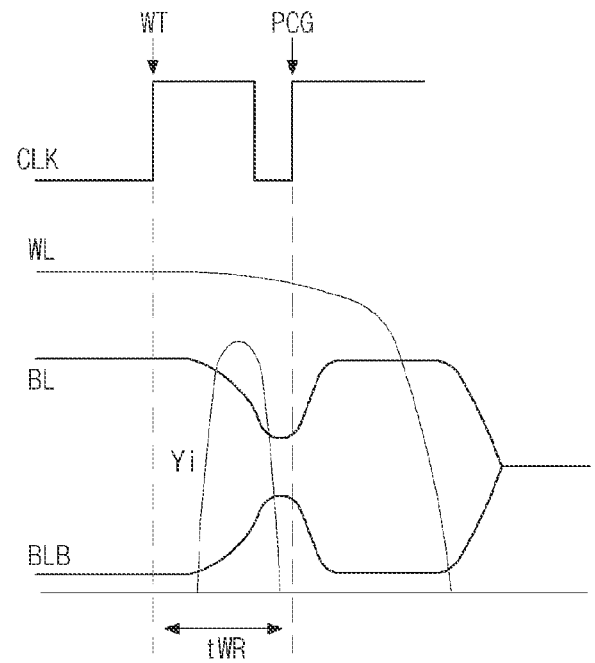
FIG. 2 illustrates a write recovery (tWR) test for use in a conventional semiconductor memory device.
Figure 3:
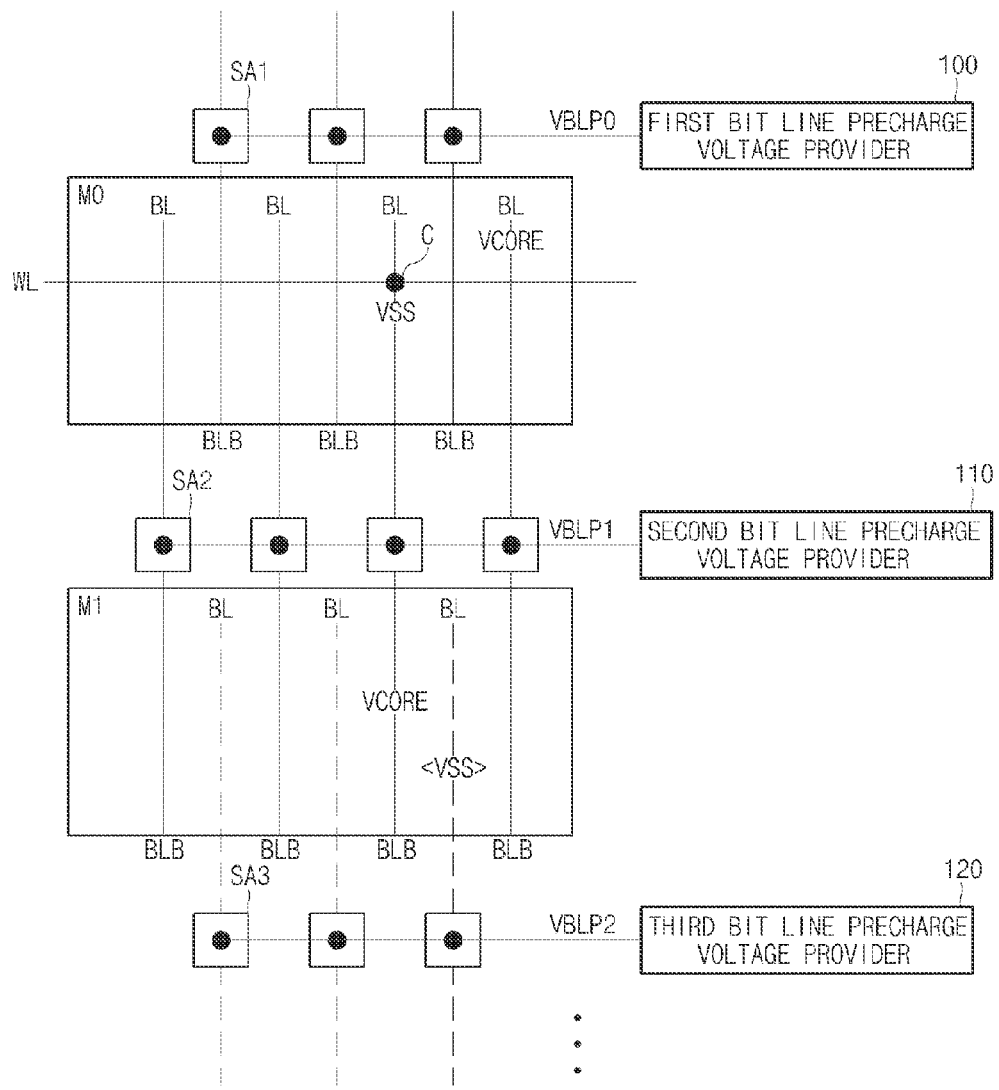
FIG. 3 illustrates a tWR test performed in a semiconductor memory device including an open bit line structure according to an embodiment of the present invention.

FIG. 3 illustrates a tWR test performed in a semiconductor memory device including an open bit line structure according to an embodiment of the present invention.

Referring to FIG. 3, the semiconductor memory device includes a plurality of memory cell mats M0 and M1, a plurality of sense amplifiers SA1~SA3, and a plurality of bit line precharge voltage providers 100~120.

Memory cells of the semiconductor memory device are configured in the form of a memory cell array in which the memory cells are regularly arranged. A group of the memory cells is called a memory cell mat. The semiconductor memory device includes the plurality of memory cell mats M0 and M1.

The memory cell mats M0 and M1 are constituent elements of the memory cell array, and the memory cell array is generally composed of a plurality of memory cell mats and a sense-amplifier region including a plurality of sense amplifiers.

The sense amplifiers SA1~SA3 indicate sense-amplifier regions disposed around the memory cell mats M0 and M1. Each of the sense-amplifiers SA1~SA3 detects a voltage difference between a true bit line BL and a false bit line BLB, and amplifies the detected voltage difference. The amplified data is transmitted to local I/O lines (not shown).

Each of the memory cell mats M0 and M1 includes a plurality of word lines WL corresponding to memory cells contained in the memory cell mat. In a data access operation, for example, a read or write operation, one word line WL corresponding to the data access operation is activated.

The sense amplifiers SA1~SA3 are coupled to a plurality of true bit lines BL and a plurality of false bit lines BLB in the memory cell mats M0 and M1.

The sense amplifier SA1 is arranged at an upper part of the memory cell mat M0, and the other sense amplifier SA2 is arranged at a lower part of the memory cell mat M0. The false bit line BLB arranged on the memory cell mat M0 is coupled to the upper sense amplifier SA1 and the true bit line BL is coupled to the lower sense amplifier SA2.

In addition, the sense amplifier SA2 is arranged at an upper part of the memory cell mat M1 and the sense amplifier SA3 is arranged at a lower part of the memory cell mat M1. The false bit line BLB arranged on the memory cell mat M1 is coupled to the upper sense amplifier SA2, and the true bit line BL is coupled to the lower sense amplifier SA3.

However, if the semiconductor memory device is configured in the form of the open bit line structure as shown in FIG. 3, the true bit line BL and the false bit line BLB coupled to one sense amplifier are disposed in different memory cell mats M0 and M1. Accordingly, when the sense amplifier operates to sense and amplify a voltage difference between the true bit line BL and the false bit line BLB, the true bit line BL and the false bit line BLB are affected by different noises.

Therefore, the semiconductor memory device according to the embodiment of the present invention includes a plurality of bit line precharge voltage providers 100~120 for additionally generating a coupling noise effect in the true bit line BL and the false bit line BLB during the write recovery (tWR) test.

The bit line precharge voltage providers 100~120 generate independent bit line precharge voltages VBLP0~VBLP2 and provide the bit line precharge voltages VBLP0~VBLP2 to the sense amplifiers SA1~SA3, respectively. The bit line precharge voltages VBLP0~VBLP2 are precharge voltages for precharging the bit lines BL and BLB.

For example, it is assumed that, during a normal operation, the word line WL of the memory cell mat M0 is selected so that a sensing operation is performed on the sense amplifier SA1 or the sense amplifier SA2, and a precharge operation is performed on the sense amplifier SA3 coupled to the non-selected memory cell mat M1.

As a result, the bit line precharge voltage providers 100 and 110 coupled to the sense amplifiers SA1 and SA2 stop supplying the bit line precharge voltages VBLP0 and VBLP1, and the sense amplifiers SA1 and SA2 are floated so that cell data can be sensed and amplified.

That is, the bit line precharge voltage providers 100 and 110 can selectively provide the bit line precharge voltages VBLP0 and VBLP1 to the sense amplifiers SA1 and SA2 in response to an active signal for selecting a specific word line WL.

For example, if the active signal is activated to select the word line WL of the memory cell mat M0, the bit line precharge voltage providers 100 and 110 stop supplying the bit line precharge voltages VBLP0 and VBLP1 to the sense amplifiers SA1 and SA2.

On the other hand, the bit line precharge voltage provider 120 coupled to the sense amplifier SA3 provides the bit line precharge voltage VBLP2 that is not fixed to a bit line precharge voltage VBLP. The bit line precharge voltage provider 120 provides a ground voltage VSS or a core voltage VCORE to the bit line precharge voltage VBLP2, which corresponds to a voltage level of a bit line coupled to a selected cell.

That is, if the active signal for selecting a specific the word line WL is deactivated, the bit line precharge voltage provider 120 coupled to the non-operated sense amplifier SA3 provides the core voltage VCORE or the ground voltage VSS to the bit line precharge voltage VBLP2, which corresponds to data of the selected cell.

In other words, a voltage level of the bit line precharge voltage VBLP2 output from the bit line precharge voltage provider 120 may be variably selected according to data polarity of the selected cell to be read.

For example, it is assumed that high data is first written in the selected cell, i.e., a target cell C, and is inverted to low data, and the tWR time is reduced in such a manner that the tWR test can be performed. In addition, it is assumed that opposite data to that of the target cell C is written in the remaining cells other than the target cell C. That is, data may be stored in the cells in an island pattern. Therefore, in accordance with the embodiment of the present invention, if the low data is written in the target cell C coupled to the selected word line WL, the ground voltage VSS is provided as the bit line precharge voltage VBLP2 to precharge the true bit lines BL of the memory cell mat M1 with the ground voltage VSS in a sensing operation of the target cell C. On the other hand, if the high data is written in the target cell C, the core voltage VCORE is provided as the bit line precharge voltage VBLP2 to precharge the true bit lines BL of the memory cell mat M1 with the core voltage VCORE, thereby providing the false bit line BLB of the memory cell mat M1, which is coupled to the target cell C through the sense amplifier SA2, with substantially the same noise as that of the true bit line BL coupled to the sense amplifier SA2 and the target cell C.

The bit line precharge voltage VBLP is a voltage level corresponding to a half of the core voltage VCORE. Therefore, a voltage level of the core voltage VCORE is higher than that of the bit line precharge voltage VBLP, and a voltage level of the ground voltage VSS is lower than that of the bit line precharge voltage VBLP.

The bit line precharge voltage providers 100~120 may selectively control the bit line precharge voltages VBLP0~VBLP2 according to memory cell mat information. The memory cell mat information may include an active signal that indicates not only specific information indicating whether the aforementioned word line WL is activated but also address information of the selected word line WL.

Therefore, this embodiment maximizes the coupling noise encountered in a read operation of a high-resistance cell, such that it can reduce a sensing margin of a sensing signal of the high-resistance cell. As a result, a read fail occurs in the high-resistance cell, such that a screen effect of the failed cell is greatly increased without mandatorily reducing the tWR time, as compared to a normal cell.

Figure 4:
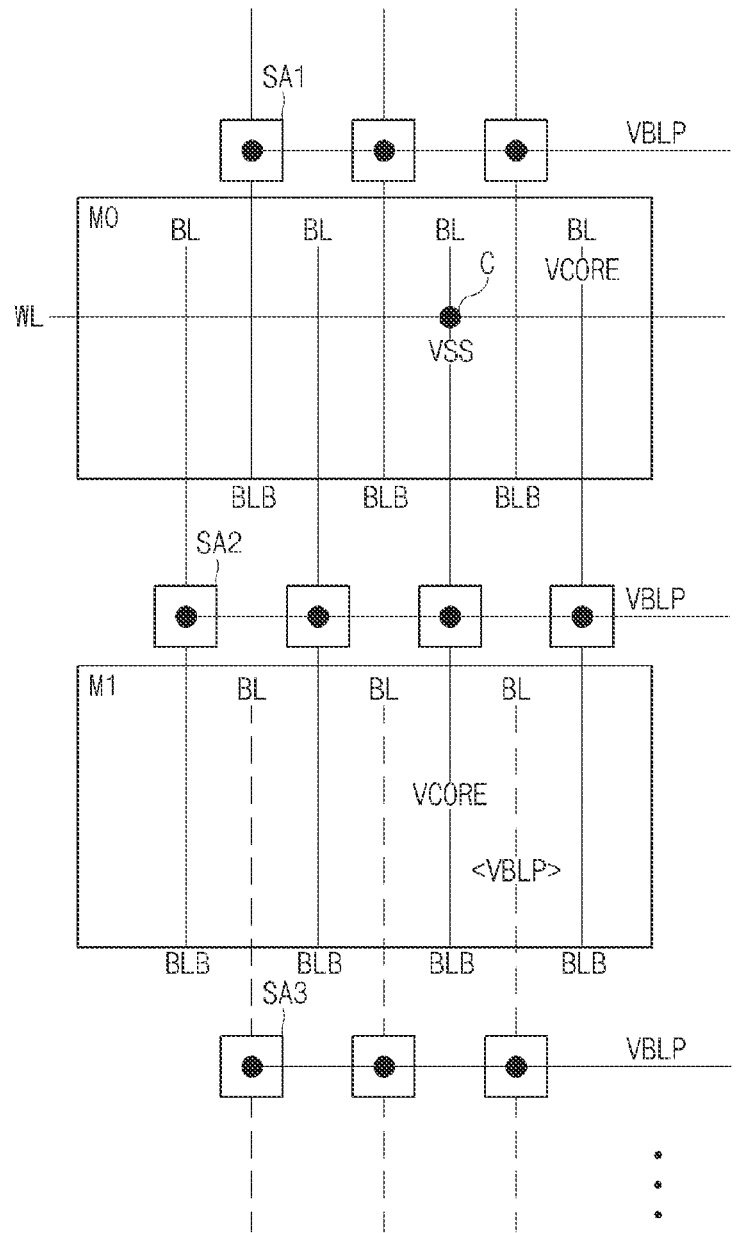
FIG. 4 illustrates a tWR test performed in a semiconductor memory device including an open bit line structure.

FIG. 4 illustrates a tWR test performed in a semiconductor memory device including the open bit line structure.

Referring to FIG. 4, for convenience of description and better understanding of the present invention, it is assumed that high data is first written in a target cell C and is inverted into low data, and the tWR time is reduced in such a manner that the tWR test can be performed. In addition, it is assumed that opposite data, e.g., low data is written in the remaining parts other than the target cell C or the target bit line BL. That is, data may be stored in the cells with an island pattern.

In order to read data of the target cell C after data is inverted to another data during the tWR time, the word line WL coupled to the target cell C of the memory cell mat M0 is selected. Thus, in the memory cell mat M0, the bit line BL of the target cell C is sensed as a ground voltage (VSS) level, and the remaining bit lines BL and BLB other than the bit line BL coupled to the target cell C are sensed as the core voltage (VCORE) level.

Meanwhile, the false bit line BLB of the memory cell mat M1 is sensed in the opposite concept to that of the true bit line BL of the memory cell mat M0. Therefore, while the false bit line BLB of the memory cell mat M1 that is coupled to the target cell C through the sense amplifier SA2 is sensed as the core voltage (VCORE) level, other false bit lines BLB of the mat M1 are sensed as the ground voltage (VSS) level.

In this case, since the true bit lines BL of the memory cell mat M1 are coupled to the non-operated sense amplifier SA3, the true bit lines BL of the memory cell mat M1 maintain the bit line precharge voltage (VBLP) level.

In other words, assuming that the target cell C is used as a reference cell, during the sensing operation, the true bit line BL of the memory cell mat M0 is sensed as the ground voltage (VSS) level and its neighbor false bit line BLB of the memory cell mat M0 is sensed as the core voltage (VCORE) level. Therefore, the true bit line BL and the false bit line BLB of the mat M0 maximize the coupling noise.

However, the false bit line BLB of the mat M1 does not receive the coupling noise because its neighbor bit line BL of the memory cell mat M1 is fixed to the bit line precharge voltage (VBLP) level.

Figure 5:
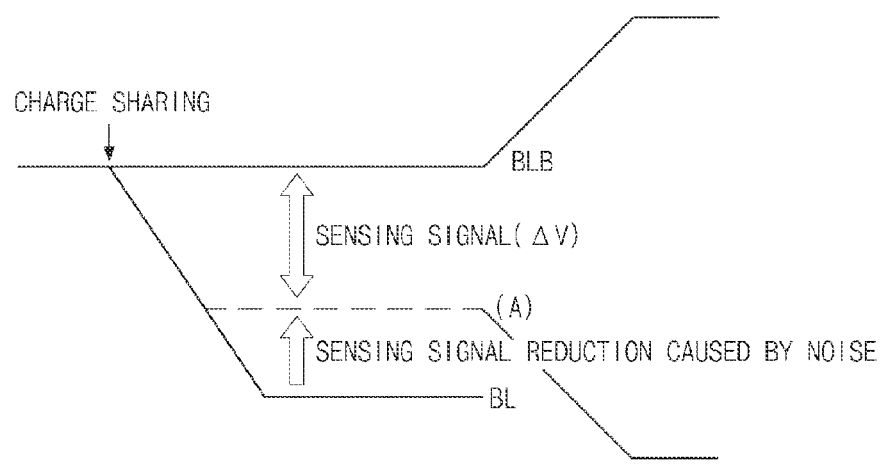
FIG. 5 illustrates a coupling noise effect of the semiconductor memory device shown in FIG. 4.

FIG. 5 illustrates a coupling noise effect in the semiconductor memory device shown in FIG. 4.

FIG. 5 shows the signal variation of the true bit line BL and the false bit line BLB of the target cell C upon completion of charges in the target cell C. As described with reference to FIG. 4, the true bit line BL is disposed in the memory cell mat M0, and the false bit line BLB is disposed in the memory cell mat M1.

Referring to FIG. 4 and FIG. 5, the true bit line BL of the memory cell mat M0 is changed to a voltage level A due to the coupling noise between the true bit line BL and its neighbor false bit line BLB in the memory cell mat M0. However, a voltage level of the false bit line BLB of the memory cell mat M1 remains unchanged because no coupling noise occurs between the false bit line BLB and its neighbor true bit line BL in the memory cell mat M1.

Accordingly, a voltage margin of the sensing signal is reduced to $\Delta V$ due to the coupling noise generated in the memory cell mat M0. However, assuming that the voltage level of the sensing signal is equal to or higher than an offset voltage of the sense amplifier SA, the sensing operation can be normally performed. In this case, data of the target cell C is read as low data.

Figure 6:
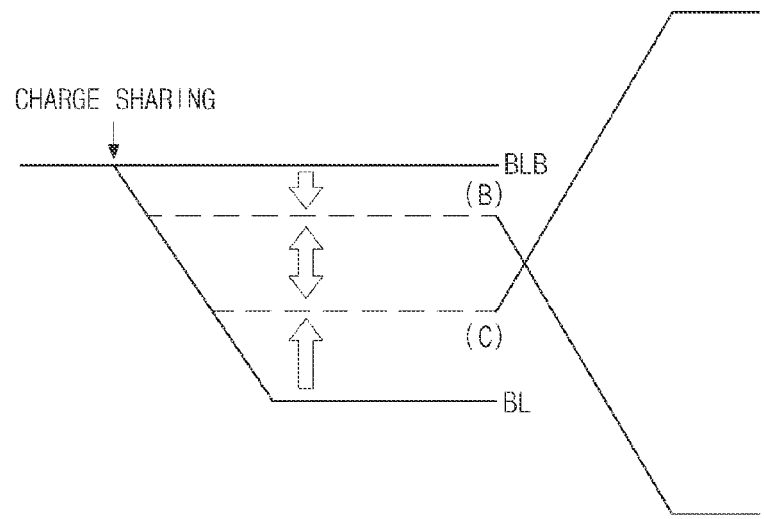
FIG. 6 illustrates a coupling noise effect of the semiconductor memory device shown in FIG. 3.

FIG. 6 illustrates the coupling noise effect in the semiconductor memory device shown in FIG. 3.

Referring to FIG. 6 and FIG. 3, the bit line precharge voltage providers 100~120 provide the bit line precharge voltages VBLP0~VBLP2 to the sense amplifiers SA1~SA3 disposed between the memory cell mats M0 and M1 so as to generate the coupling noise effect.

In this case, the bit line precharge voltages VBLP0~VBLP2 may be established as the core voltage VCORE, the ground voltage VSS, or the bit line precharge voltage VBLP.

That is, if the word line WL of the memory cell mat M0 is selected, the bit line precharge voltages VBLP0 and VBLP1 are not provided to the sense amplifiers SA1 and SA2, and thus the sense amplifier SA3 is floated so that cell data of the memory cell mat M0 can be sensed.

However, the third bit line precharge voltage provider 120 provides the bit line precharge voltage VBLP2 having a voltage level corresponding to the cell data loaded on the true bit line BL coupled to the target cell C. For example, if low data is applied to the true bit line BL coupled to the target cell C, the ground voltage VSS is provided to the true bit lines BL coupled to the sense amplifier SA3 as the bit line precharge voltage VBLP2. On the other hand, if high data is applied to the true bit line BL coupled to the target cell C, the core voltage VCORE is provided to the true bit lines BL coupled to the sense amplifier SA3 as the bit line precharge voltage VBLP2.

FIG. 3 shows that the low data is applied to the true bit line BL coupled to the target cell C. Therefore, the true bit line BL of the memory cell mat M1 coupled to the sense amplifier SA3 has the ground voltage (VSS) level. In this case, the false bit line BLB of the memory cell mat M1 coupled to the sense amplifier SA2 maintains the core voltage VCORE. Accordingly, the false bit line BLB of the memory cell mat M1 is affected by the coupling noise due to its neighbor true bit lines BL.

Therefore, the true bit line BL of the memory cell mat M0 is changed to a voltage level C due to the coupling noise between the true bit line BL and its neighbor false bit line BLB of the memory cell mat M0.

In addition, if the false bit line BLB coupled to the target cell C through the sense amplifier SA2 is affected by the coupling noise, a voltage level of the false bit line BLB is changed to a voltage level B after completion of charge sharing. As a result, a margin of the overall sensing signal is greatly reduced as compared to that shown in FIG. 5.

That is, the sensing margin of the sense amplifier SA2 is reduced to a voltage difference between the voltage levels B and C due to the coupling noise generated in the memory cell mats M0 and M1.

If the voltage difference between the voltage levels B and C is lower than the offset of the sense amplifier SA, it is impossible to normally perform the sensing operation. Therefore, the target cell C may be read as having high data instead of expected low data, such that the target cell C can be determined to be a failed cell during the screen operation.

The semiconductor memory device according to the embodiment of the present invention is designed to further generate the coupling noise effect in the bit lines BL and BLB during the tWR test, instead of using the conventional method where the tWR test is performed by mandatorily reducing the tWR time. In other words, the present invention can further screen a cell having a small voltage margin $\Delta V$ of the sensing signal due to high resistance.

As is apparent from the above description, the semiconductor memory device including the open bit line structure according to the embodiment of the present invention can adjust the sensing noise applied to a true bit line to be equal to the sensing noise applied to a false bit line in a test mode for a probe test, which results in improving screenability of the probe test.

Those skilled in the art will appreciate that the present invention may be carried out in other specific ways than those set forth herein without departing from the spirit and essential characteristics of the present invention. The above exemplary embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein. Also, it is obvious to those skilled in the art that claims that are not explicitly cited in each other in the appended claims may be presented in combination as an exemplary embodiment of the present invention or included as a new claim by a subsequent amendment after the application is filed.

Although a number of illustrative embodiments consistent with the invention have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

providing a selected cell storing first data and a non-selected cell storing second data that has a logic state opposite to that of the first data, wherein the selected cell and the non-selected cell are coupled to a selected word line and disposed adjacent to each other; activating the selected word line to read out the data stored in the selected cell and the non-selected cell; and sensing and amplifying a voltage level loaded on a first bit line coupled to the selected cell to determine whether or not the selected cell is failed, wherein, when sensing and amplifying the voltage level loaded on the first bit line, a bit line precharge voltage corresponding to the first data stored in the selected cell is provided to a third bit line adjacent to a second bit line coupled to a sense amplifier that senses and amplifies the voltage level loaded on the first bit line, the second and third bit line being disposed in a second memory cell mat that is adjacent to a first memory cell mat where the selected cell is disposed.

What is claimed is:

1. A method of testing a semiconductor memory device including an open bit line structure, the method comprising:

providing a selected cell storing first data and a non-selected cell storing second data that has a logic state opposite to that of the first data, wherein the selected cell and the non-selected cell are coupled to a selected word line and disposed adjacent to each other;

activating the selected word line to read out the data stored in the selected cell and the non-selected cell; and sensing and amplifying a voltage level loaded on a first bit line coupled to the selected cell to determine whether or not the selected cell is failed, wherein, when sensing and amplifying the voltage level loaded on the first bit line, a bit line precharge voltage corresponding to the first data stored in the selected cell is provided to a third bit line adjacent to a second bit line coupled to a sense amplifier that senses and amplifies the voltage level loaded on the first bit line, the second and third bit line being disposed in a second memory cell mat that is adjacent to a first memory cell mat where the selected cell is disposed.

2. The method according to claim 1, wherein, when sensing and amplifying the voltage level loaded on the first bit line, bit line precharge voltages are not provided to the first and second bit lines and a bit line coupled to the non-selected cell.

3. The method according to claim 1, wherein, if the first data stored in the selected cell is low data, a ground voltage is applied to the third bit line.

4. The method according to claim 1, wherein, if the first data stored in the selected cell is high data, a core voltage is applied to the third bit line.

* * * * *